United States Patent
Lee et al.

(10) Patent No.: US 9,070,782 B2
(45) Date of Patent: Jun. 30, 2015

(54) SEMICONDUCTOR STRUCTURE

(71) Applicant: INOTERA MEMORIES, INC., Taoyuan (TW)

(72) Inventors: Tzung-Han Lee, Taipei (TW); Yaw-Wen Hu, Taoyuan County (TW); Hung-Chang Liao, Taipei (TW); Chung-Yuan Lee, Taoyuan County (TW); Hsu Chiang, New Taipei (TW); Sheng-Hsiung Wu, Taipei (TW)

(73) Assignee: INOTERA MEMORIES, INC., Hwa-Ya Technology Park Kueishan, Taoyuan (TW)

( * ) Notice: Subject to any disclaimer, the term of this patent is extended or adjusted under 35 U.S.C. 154(b) by 167 days.

(21) Appl. No.: 13/831,879

(22) Filed: Mar. 15, 2013

(65) Prior Publication Data
US 2014/0117442 A1   May 1, 2014

(30) Foreign Application Priority Data
Nov. 1, 2012   (TW) .............................. 101140493 A

(51) Int. Cl.
| | |
|---|---|
| H01L 29/76 | (2006.01) |
| H01L 29/94 | (2006.01) |
| H01L 21/8234 | (2006.01) |
| H01L 21/768 | (2006.01) |
| H01L 23/485 | (2006.01) |
| H01L 27/108 | (2006.01) |

(52) U.S. Cl.
CPC ... *H01L 21/823456* (2013.01); *H01L 27/10823* (2013.01); *H01L 27/10885* (2013.01); *H01L 27/10888* (2013.01); *H01L 27/10894* (2013.01); *H01L 21/76895* (2013.01); *H01L 21/76897* (2013.01); *H01L 23/485* (2013.01); *H01L 21/76807* (2013.01); *H01L 2924/0002* (2013.01)

(58) Field of Classification Search
CPC ...................... H01L 27/088; H01L 21/76877
USPC .......................................... 257/334; 438/675
See application file for complete search history.

(56) References Cited

U.S. PATENT DOCUMENTS

| | | | |
|---|---|---|---|
| 2005/0196951 A1 | 9/2005 | Lin | |
| 2008/0266927 A1* | 10/2008 | Lee et al. | ........................ 365/63 |
| 2009/0134497 A1 | 5/2009 | Barth | |

FOREIGN PATENT DOCUMENTS

| | | |
|---|---|---|
| TW | 201133798 | 10/2011 |
| TW | 201203458 | 1/2012 |

* cited by examiner

*Primary Examiner* — Theresa T Doan
(74) *Attorney, Agent, or Firm* — Winston Hsu; Scott Margo

(57) ABSTRACT

A semiconductor structure includes multiple buried gates which are disposed in a substrate and have a first source and a second source, an interlayer dielectric layer covering the multiple buried gates and the substrate as well as a core dual damascene plug including a first plug, a second plug and an insulating slot. The insulating slot is disposed between the first plug and the second plug so that the first plug and the second plug are mutually electrically insulated. The first plug and the second plug respectively penetrate the interlayer dielectric layer and are respectively electrically connected to the first source and the second source.

10 Claims, 9 Drawing Sheets

SEMICONDUCTOR STRUCTURE

BACKGROUND OF THE INVENTION

1. Field of the Invention

The present invention generally relates to a semiconductor structure, and a method for forming a landing pad with a maximized area. Specifically speaking, the present invention relates to a method for forming a landing pad with a maximized area to obtain a semiconductor structure with a maximized area serving as landing pads. In such a way, a reticle process maybe omitted and the area for landing pads is maximized, which is favorable for a process window as larger as possible.

2. Description of the Prior Art

A semiconductor element is a basic structure for most of the electronic components. In a semiconductor element structure, there are usually functional components, such as a source, a drain and a gate. Further in the core region and in the peripheral region, there are also semiconductor elements of different functions. Still, in order to be able to accommodate semiconductor elements as many as possible, the use of a buried gate structure is a prevailing trend.

However, on one hand, the buried gate structure which is deeply buried in the interlayer dielectric layer and in the substrate must be externally electrically connected by an upward plug. However, since the buried gate structures which are deeply buried in the interlayer dielectric layer and in the substrate are so densely arranged, plus the intrinsic limitations of the lithographic resolution (exposure resolution), the landing pad area which serves as the contact plugs is getting less and less adequate and the result takes its toll on the process window of follow procedures seriously. On the other hand, because the functions of the semiconductor elements are different in the core region and in the peripheral region, different steps are required to respectively construct the etching holes which are needed by landing pads of different functions so the overall process becomes more complicated.

As a result, it is still needed to develop a novel semiconductor structure as well as a corresponding method of forming the same, to obtain a semiconductor structure with a maximized area for landing pads.

SUMMARY OF THE INVENTION

Accordingly, the present invention proposes a novel semiconductor structure as well as a corresponding method of forming the same, to obtain a semiconductor structure with a maximized area for landing pads. The method of the present invention not only omits a procedure for costly reticles, but also is able to maximize the landing pad area as much as possible, which is favorable for enlarging the process window of following procedures as much as possible.

The present invention in a first aspect proposes a semiconductor structure. The semiconductor structure of the present invention includes a substrate, a first buried gate, a second buried gate, a first source, a first drain, a second source, an interlayer dielectric layer and a core dual damascene plug. The first buried gate is disposed in the substrate, and the second buried gate is disposed in the substrate and adjacent to the first buried gate. The first source is disposed between the first buried gate and the second buried gate, the first drain is disposed at one side of the first buried gate, and the second source is disposed at one side of the second buried gate. The interlayer dielectric layer covers the first buried gate, the second buried gate and the substrate. The core dual damascene plug includes a first plug, a second plug and an insulating slot. The insulating slot is disposed between the first plug and the second plug so that the first plug and the second plug are mutually electrically insulated from each other. Further, the first plug and the second plug respectively penetrate the interlayer dielectric layer to be respectively electrically connected to the first source and to the second source.

In one embodiment of the present invention, the core dual damascene plug is disposed right above the first source.

In another embodiment of the present invention, the core dual damascene plug is Π-shaped.

In another embodiment of the present invention, the insulating slot is disposed right above the first source and the second source.

In another embodiment of the present invention, the width of the insulating slot is not only smaller than the width of the buried gate, but also smaller than the width of the first plug and the second plug.

In another embodiment of the present invention, the first plug and second plug are respectively T-shaped, and have a maximized landing pad area.

In another embodiment of the present invention, the semiconductor structure further includes a bit line contact disposed in the interlayer dielectric layer and electrically connected to the first drain, a bit line disposed in the interlayer dielectric layer, above the bit line contact and electrically connected to the bit line contact, the bit line and core dual damascene plug are mutually electrically insulated, and an insulating layer covering the bit line and in direct contact with the insulating slot so that the first plug and second plug respectively penetrate the insulating layer.

In another embodiment of the present invention, the semiconductor structure further includes a periphery gate disposed on the substrate and in the interlayer dielectric layer, and a periphery dual damascene plug integrally formed by the first plug and the second plug. The periphery dual damascene plug penetrates the interlayer dielectric layer to be electrically connected to the substrate and to the periphery gate. The periphery dual damascene plug is Π-shaped.

In another embodiment of the present invention, the periphery dual damascene plug stays away from the core dual damascene plug, and does not directly contact the bit line and the insulating layer at the same time.

The present invention in another aspect proposes a method for the formation of the landing pad with a maximized area. First, a matrix is provided. The matrix includes a substrate, a first buried gate, a second buried gate, a peripheral gate, a first source, a second source, a first drain, an interlayer dielectric layer, a bit line contact, a bit line, and an insulated layer. The first buried gate is disposed in the substrate. The second buried gate is disposed in the substrate and adjacent to the first buried gate. The peripheral gate is disposed on the substrate and stays away from both the first buried gate and the second buried gate. The first source is disposed between the first buried gate and the second buried gate. The second source is disposed at one side of the second buried gate. The first drain is disposed at one side of the first buried gate. The interlayer dielectric layer covers the first buried gate, the second buried gate, the substrate and the peripheral gate. The bit line contact is disposed in the interlayer dielectric layer and electrically connected to the first drain. The bit line is disposed in the interlayer dielectric layer, above the bit line contact and electrically connected to the bit line contact. The insulating layer covers the bit line. Second, a dual damascene procedure is carried out to partially remove the interlayer dielectric layer and the insulating layer simultaneously to form a core dual damascene opening disposed right above the first buried gate, and to form a peripheral dual damascene opening disposed above the peripheral gate. The core dual damascene opening penetrates the interlayer dielectric layer and the insulating layer to expose the first source and the second source, and the peripheral dual damascene opening exposes the peripheral gate. Then, the core dual damascene opening and the peripheral dual damascene opening are filled with a conductive material to respectively form a core dual damascene plug and a peripheral dual damascene plug. Next, the conductive material in the core dual damascene plug is selectively removed to form a first plug, a second plug and a slot. The slot is disposed between the first plug and the second plug so that the first plug and the second plug are mutually electrically insulated from each other.

In one embodiment of the present invention, the peripheral dual damascene plug is free of the slot.

In another embodiment of the present invention, the core the dual damascene plug is Π-shaped.

In another embodiment of the present invention, the first plug and the second plug are respectively electrically connected to the first source and the second source.

In another embodiment of the present invention, the first plug and the second plug are respectively T-shaped and have a maximized landed pad area.

In another embodiment of the present invention, to selectively remove the conductive material in the core dual damascene plug further includes the following steps. First, a photoresist having an opening disposed on the conductive material is formed so that the opening is disposed right above and between the first buried gate and the second buried gate, and exposes the underlying conductive material. The opening has a minimum size with respect to a lithographic capability. Second, an inner spacer within the opening is formed in order to reduce the size of the opening. Then, the conductive material is etched through the opening in the presence the inner spacer to obtain the slot. Next, the slot is filled with an insulating material to obtain an insulating slot.

In another embodiment of the present invention, the insulating slot is disposed right above and between the first source and the second source.

In another embodiment of the present invention, the width of the insulating slot is smaller than that of the first buried gate, of the first plug and of the second plug.

In another embodiment of the present invention, the insulating slot is in direct contact with the insulating layer.

In another embodiment of the present invention, the first plug and the second plug respectively penetrate the interlayer dielectric layer to be electrically insulated from the bit line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
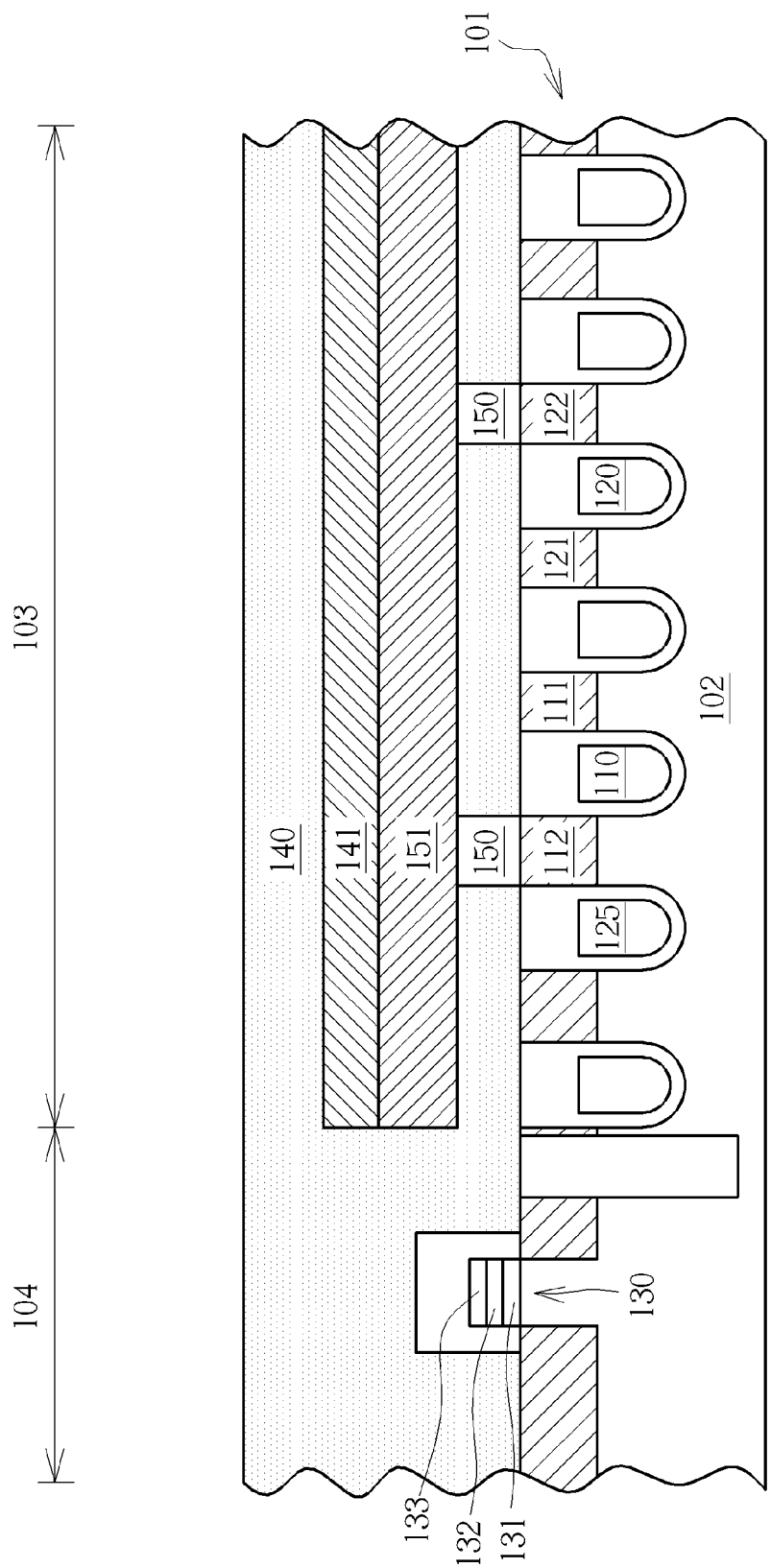
FIG. 1 to FIG. 8 illustrate an embodiment of the present invention for the formation of the landing pad with maximized area, in which FIG. 5 to FIG. 8 illustrates the selective removal of part of the conductive material of the core dual damascene plug to obtain the needed slot and further an insulating slot.

The present invention provides a method of forming a semiconductor structure having an area to maximize the landing pad, and the corresponding resultant structure. The method of the present invention not only may omit a costly reticle process, but also able to maximize the area of the landing pad without causing short circuit, which is favorable for enlarging the process window of following procedures as much as possible.

Please refer to FIG. 1 to FIG. 8, illustrating an embodiment of the present invention for the formation of the landing pad with a maximized area. First, a matrix 101 is provided. In the matrix 101 of the present invention there are various semiconductor elements formed in advance, such as a substrate 102, a first buried gate 110, a second buried gate 120, a peripheral gate 130, a first source 111, a second source 121, a first drain 112, a second drain 122, an interlayer dielectric layer 140, an insulating layer 141, a bit line contact 150 and a bit line 151.

The substrate 102 usually includes a semiconductor material, such as silicon, in which some pre-established conventional semiconductor elements, for example a first buried gate 110, a second buried gate 120, a peripheral gate 130, a first source 111, a second source 121, a first drain 112 and a second drain 122 are formed in accordance with conventional manners. In other words, the first buried gate 110 is disposed in the core region 103 of the substrate 102, and the second buried gate 120 is also disposed in the core region 103 of the substrate 102 and adjacent to the first buried gate 110. Further, there may be a third buried gate 125 disposed in the substrate 102 and adjacent to another side of the first buried gate 110.

On one hand, the first source 111 is disposed between the first buried gate 110 and the second buried gate 120. On the other hand, the first drain 112 is disposed at one side of the first buried gate 110; the second source 121 is disposed at one side of the second buried gate 120 and the second drain 122 is disposed at another side of the second buried gate 120. Preferably, the first source 111 and the second source 121 are disposed adjacent to each other, without any other source or drain disposed therebetween. In addition, the peripheral gate 130 is disposed in the peripheral region 104 on the substrate 102, and disposed away from the first buried gate 110 and the second buried gate 120. The gate conductive material of the peripheral gate 130 may be a single material or a combination of a nonmetal material 131 and a metal material 132, such as polysilicon and tungsten, and tungsten 132 may be capped by an insulating material 133, such as silicon nitride.

The interlayer dielectric layer 140 covers the first buried gate 110, the second buried gate 120, the peripheral gate 130 and the substrate 102, and may be silicon oxide. The bit line contact 150 is disposed in the interlayer dielectric layer 140, above the first drain 112 and the second drain 122, and respectively electrically connected to the first drain 112 and the second drain 122. The bit line 151 is disposed on the bit line contact 150, in the interlayer dielectric layer 140 and extends along a particular direction to electrically connect a plurality of bit line contacts, for example, the multiple bit line contacts 150. The insulating layer 141 is disposed on the bit line 151, covers the bit line 151, and may be silicon nitride, for example.

Preferably, the insulating layer 141, the bit line contact 150 and the bit line 151 is disposed exclusively in the core region 103, or they are not disposed in the peripheral region 104. The procedures to form the first buried gate 110, the second buried gate 120, the first source 111, the second source 121, the first drain 112, the second drain 122, the peripheral gate 130, the interlayer dielectric layer 140, the insulating layer 141, the bit line contact 150 and the bit line 151 are well known by persons in this field, and accordingly will not be elaborated here.

Figure 2:
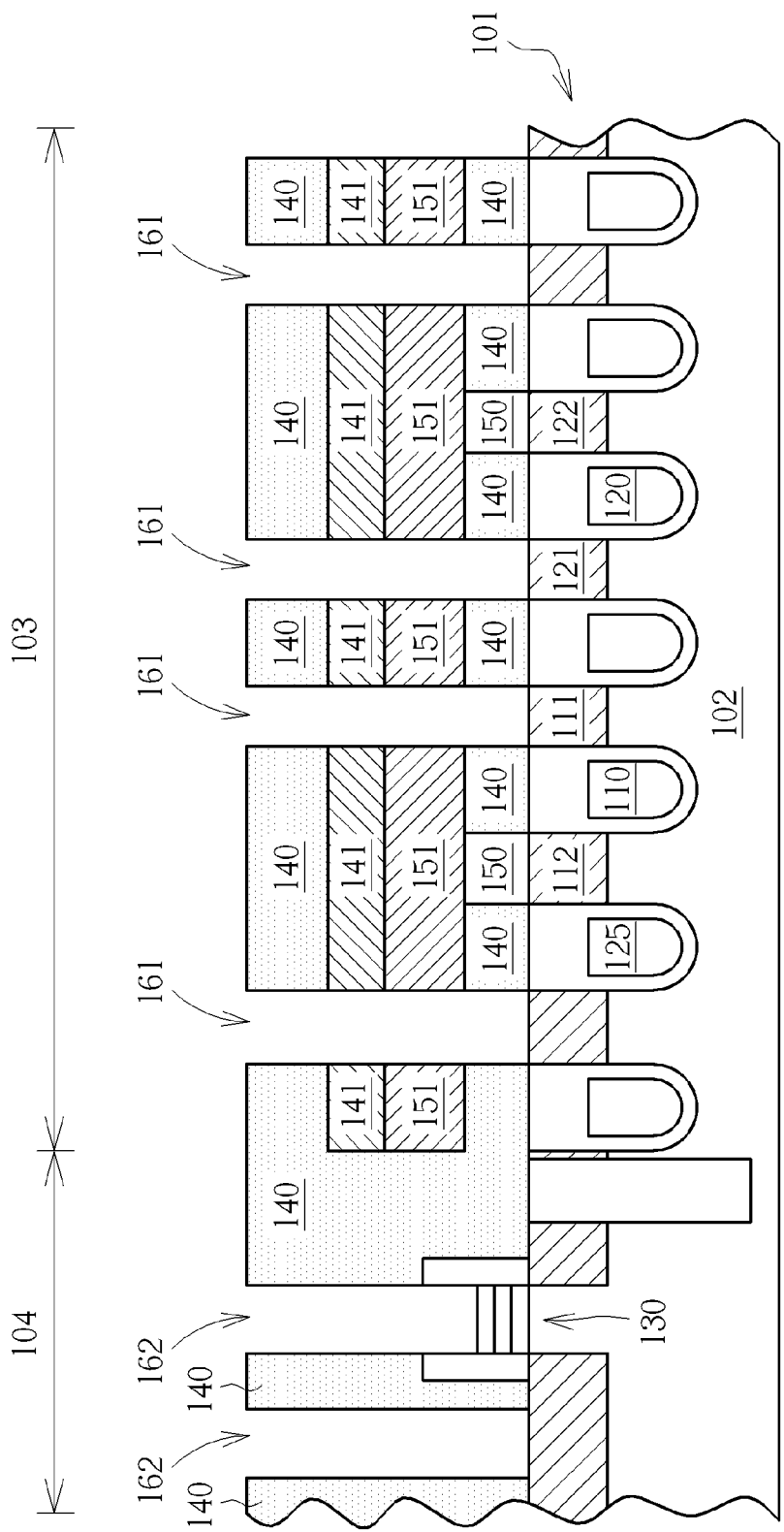
Figure 3:
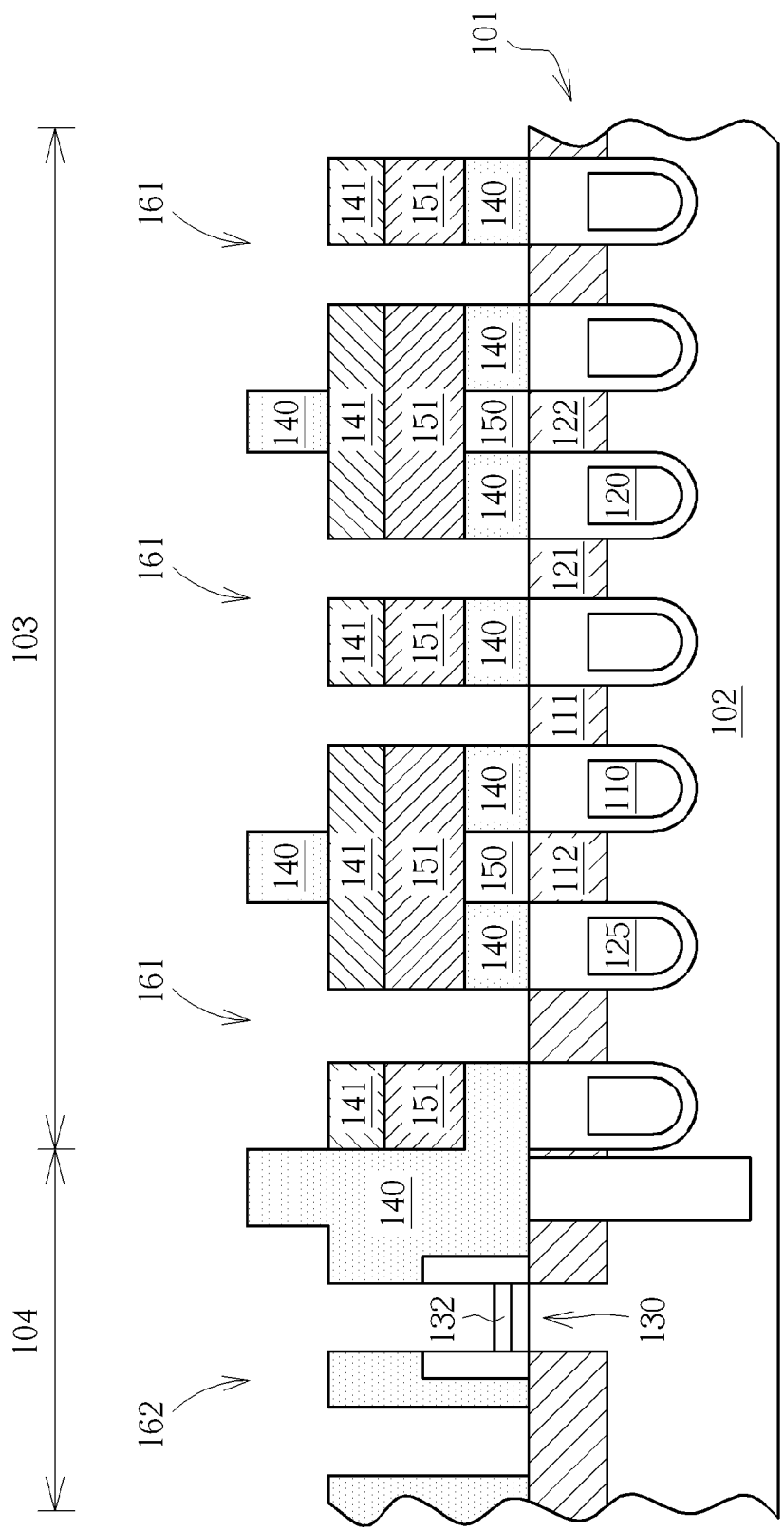

Second, a dual damascene plug process is carried out to partially remove the interlayer dielectric layer 140 and the insulating layer 141. A lithographic method along with an etching method may be carried out and adjusted to perform the dual damascene plug process. For example, as shown in FIG. 2, firstly an etching step is used to form a via, then as shown in FIG. 3, another etching step is used to form a trench to complete the dual damascene plug process. The dual damascene plug process forms a core dual damascene opening 161 right above the first buried gate 110 and the second buried gate 120 in the core region 103, as well as a peripheral dual damascene opening 162 right above the peripheral gate 130. In such a way, a reticle to separately form the core dual damascene opening and the peripheral dual damascene opening along with the necessary lithographic and etching steps may be omitted, while the peripheral dual damascene opening 162 is completed in advance along with the completion of the core dual damascene opening 161.

The core dual damascene opening 161 penetrates the interlayer dielectric layer 140 and the insulating layer 141 to exclusively expose the first source 111, the second source 121, or other regions disposed in the substrate 102. Also, the peripheral dual damascene opening 162 in the peripheral region 104 similarly exposes the substrate 102 and the gate conductive material, such as a metal, of the peripheral gate 130. Please note that the remaining interlayer dielectric layer 140 which is disposed between the adjacent core dual damascene openings 161 and not removed by the dual damascene plugs process has a width which is the smaller the better. The width of the interlayer dielectric layer 140 can be narrowed down as much as possible by adjusting the etching method for the formation of the trench.

Figure 4:
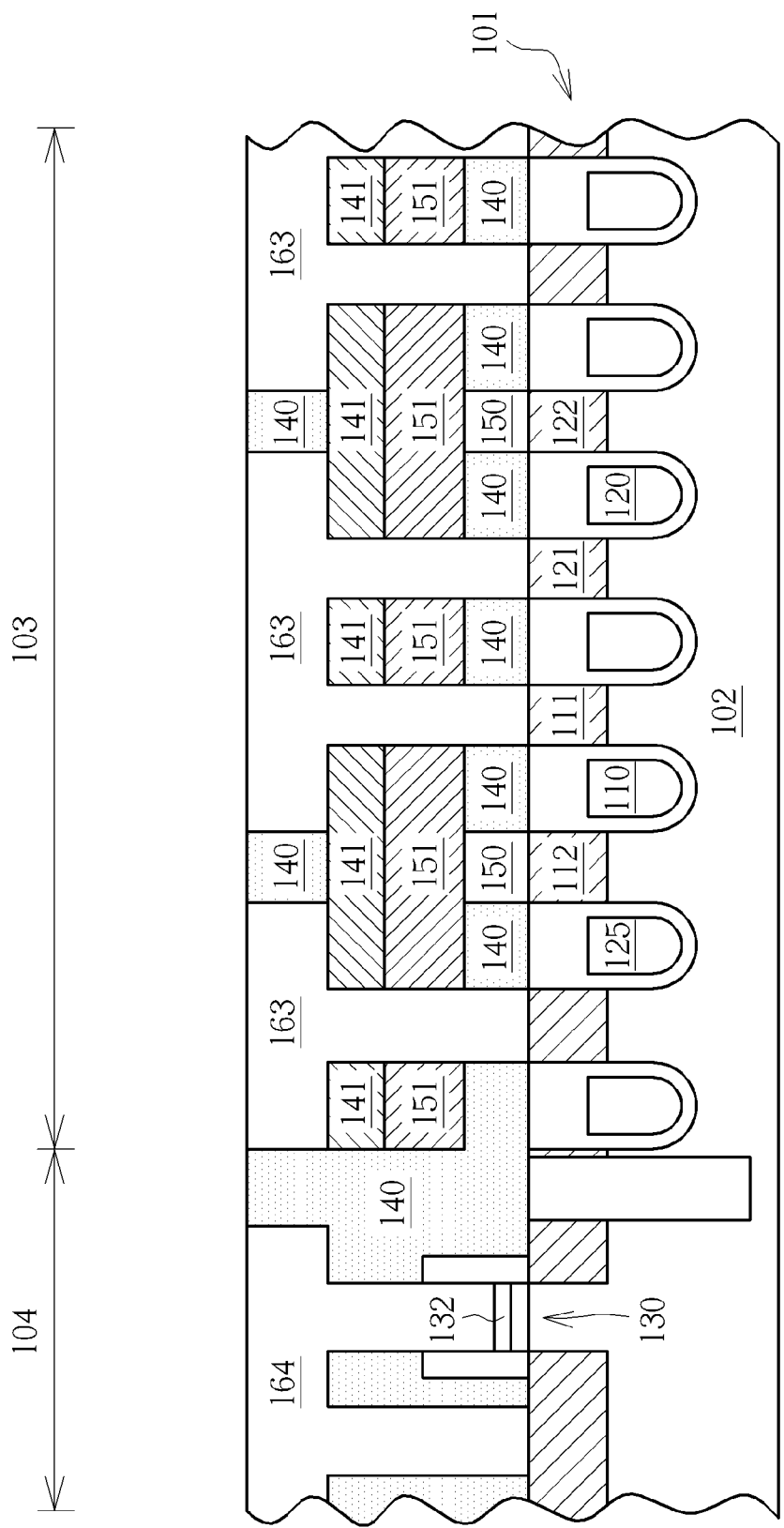

Then, as shown in FIG. 4, a conductive material is used to fill the core dual damascene opening 161 and the peripheral dual damascene opening 162 at the same time, to respectively form the core dual damascene plug 163 as well as the periphery dual damascene plug 164. In one embodiment of the present invention, the core dual damascene plug 161 and the peripheral dual damascene plug 164 may respectively have different shapes, for example, Π-shaped or T-shaped, while the core dual damascene plug 161 is disposed right above the first source 111 and the second source 121.

For example, the conductive material, such as tungsten, may fill up the core dual damascene opening 161 and the peripheral dual damascene opening 162 by deposition. Optionally, a chemical mechanical polishing (CMP) process may be used to remove any excess conductive material, to planarize the surface of the core dual damascene plug 163 and the peripheral dual damascene plug 164. The peripheral dual damascene plug 164 penetrates the interlayer dielectric layer 140 to electrically connect the gate conductive material of the peripheral gate 130 and the substrate 102. In one embodiment of the present invention, the peripheral dual damascene plug 164 stays away from the core dual damascene plug 163, while stays away from the bit line 151 and the insulating layer 141 without any direct contact.

Figure 8:
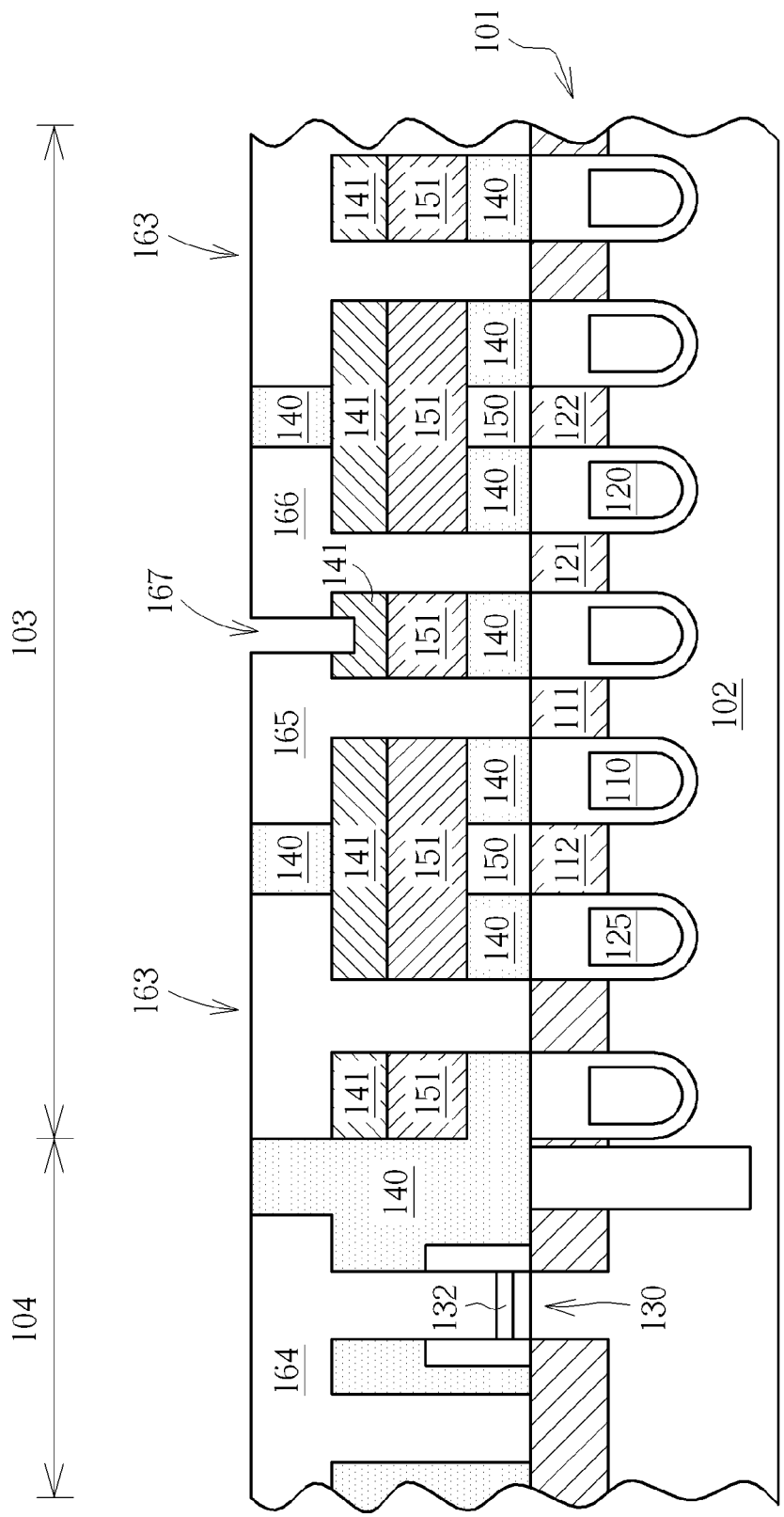

Later, as shown in FIG. 8, one feature of the present invention resides in that: part of the conductive material of the core dual damascene plug 163 needs selectively removing to form a first plug 165, a second plug 166 and a slot 167 so that the first plug 165 and the second plug 166 are electrically insulated from each other due to the presence of the slot 167 disposed between them. In one embodiment of the present invention, the first plug 165 and the second plug 166 are T-shaped, to respectively electrically connect the first source 111 and the second source 121. However, in another embodiment of the present invention, the peripheral dual damascene plug 164 is free of this slot. Therefore, the slot 167 is exclusively disposed between the first plug 165 and the second plug 166 of the core dual damascene plug 163. Please note that the first plug 165 and the second plug 166 of the present invention not only respectively penetrate the interlayer dielectric layer 140, but also the first plug 165 and the second plug 166 just pass through the interlayer dielectric layer 140 which is disposed right between two adjacent bit lines 161, so both the first plug 165 and the second plug 166 are electrically insulated from the bit line 161.

Figure 5:
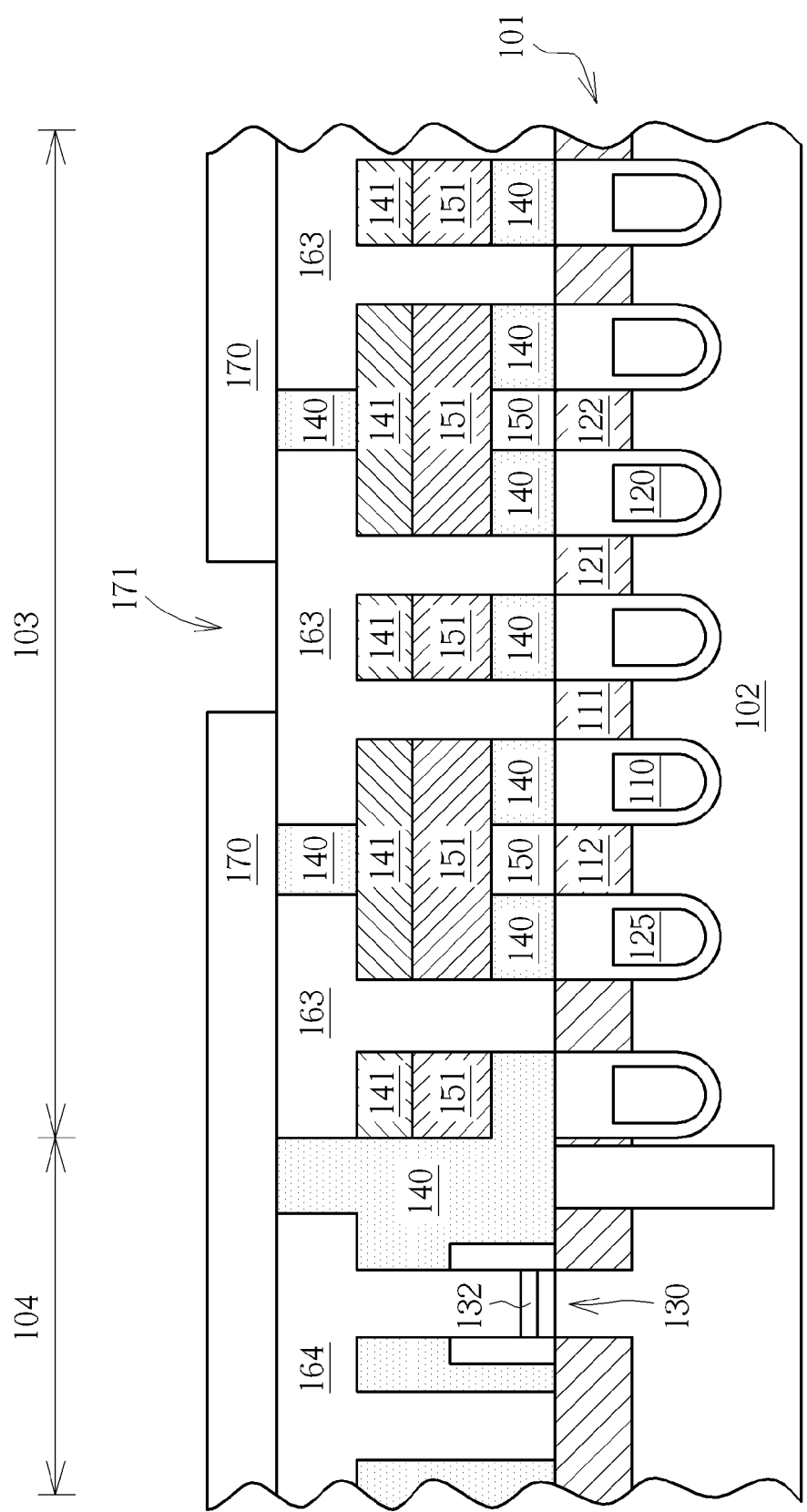

Preferably, the slot 167 also passes through part of the insulating layer 141 and has a size smaller than the possible minimum size which is obtained by merely using a lithographic process, for example the slot 167 has a width smaller than the width of the opening 171 in FIG. 5, smaller than that of the first buried gate 110, as well as smaller than that of the first plug 165 and the second plug 166. Since the size of the slot 167 itself and the remaining interlayer dielectric layer 140 are all as small as possible, the area of the first plug 165 and of the second plug 166 which both serve as a landing pad may be as large as possible. A lithographic method may be used and adjusted along with an etching method to selectively remove part of the conductive material of the core dual damascene plug 163, so as to obtain the desirable slot 167.

FIG. 5 to FIG. 8 illustrates the selective removal of part of the conductive material of the core dual damascene plug 163 to obtain the needed slot and further an insulating slot. For example, as shown in FIG. 5, firstly a photoresist 170 with an opening 171 is formed on the conductive material of the core dual damascene plug 163. The opening 171 is disposed just right above and between the first buried gate 110 and the second buried gate 120, and exposes the conductive material of the core dual damascene plug 163. Please pay special attention to the condition that the opening has a size which is the minimum size achievable by mere lithographic capability.

Figure 6:
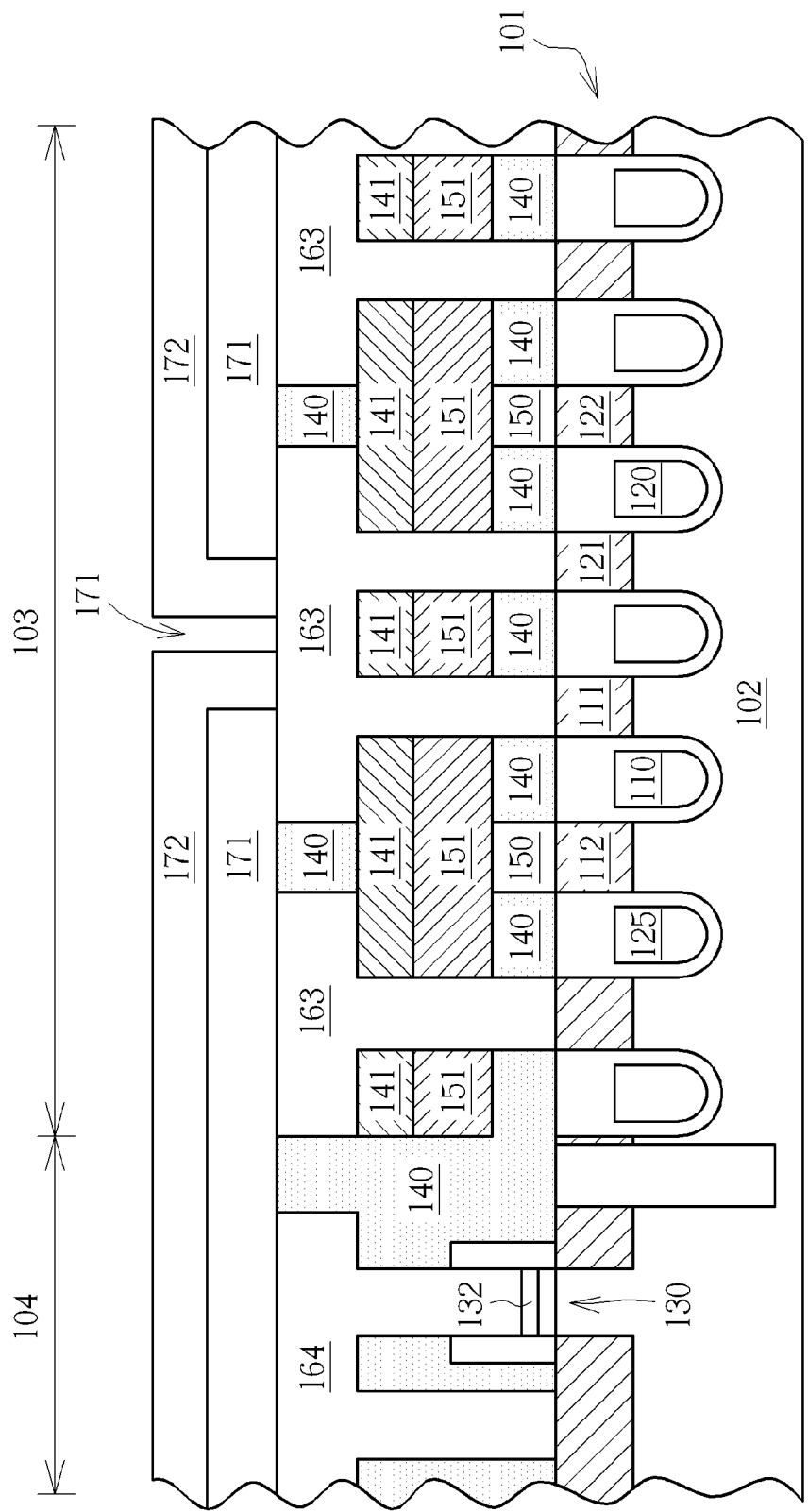

Then, as shown in FIG. 6, an inner spacer is formed inside the opening 171, to reduce the dimension of the opening 171 as much as possible. The formation of the inner spacer 172 inside the opening 171 may refer to the following proposed procedures. First, a thin dielectric layer 172 with a specific dimension is deposited. The thin dielectric layer 172 not only covers the photoresist 170 but also fill the openings 171, and accordingly reduce the width of the opening 171. The reduction of the width of the opening 171 is adjusted by the specific dimension of the thin dielectric layer 172. For example, the larger the specific dimension of the thin dielectric layer 172 the smaller the remaining width of the opening 171. In such a way, it is possible to control the final width of the insulating slot 168 by means of the adjustment of the specific dimension of the thin dielectric layer 172. It is advisable that the final width of the insulating slot 168 is the smaller the better without the collateral occurrence of contour problems such as a bridged result, or a deficient etching result. Next, an over-etching to remove the horizontal part of the thin dielectric layer 172 is carried out to obtain the inner spacer 172 which vertically remains inside the opening 171.

Figure 7:
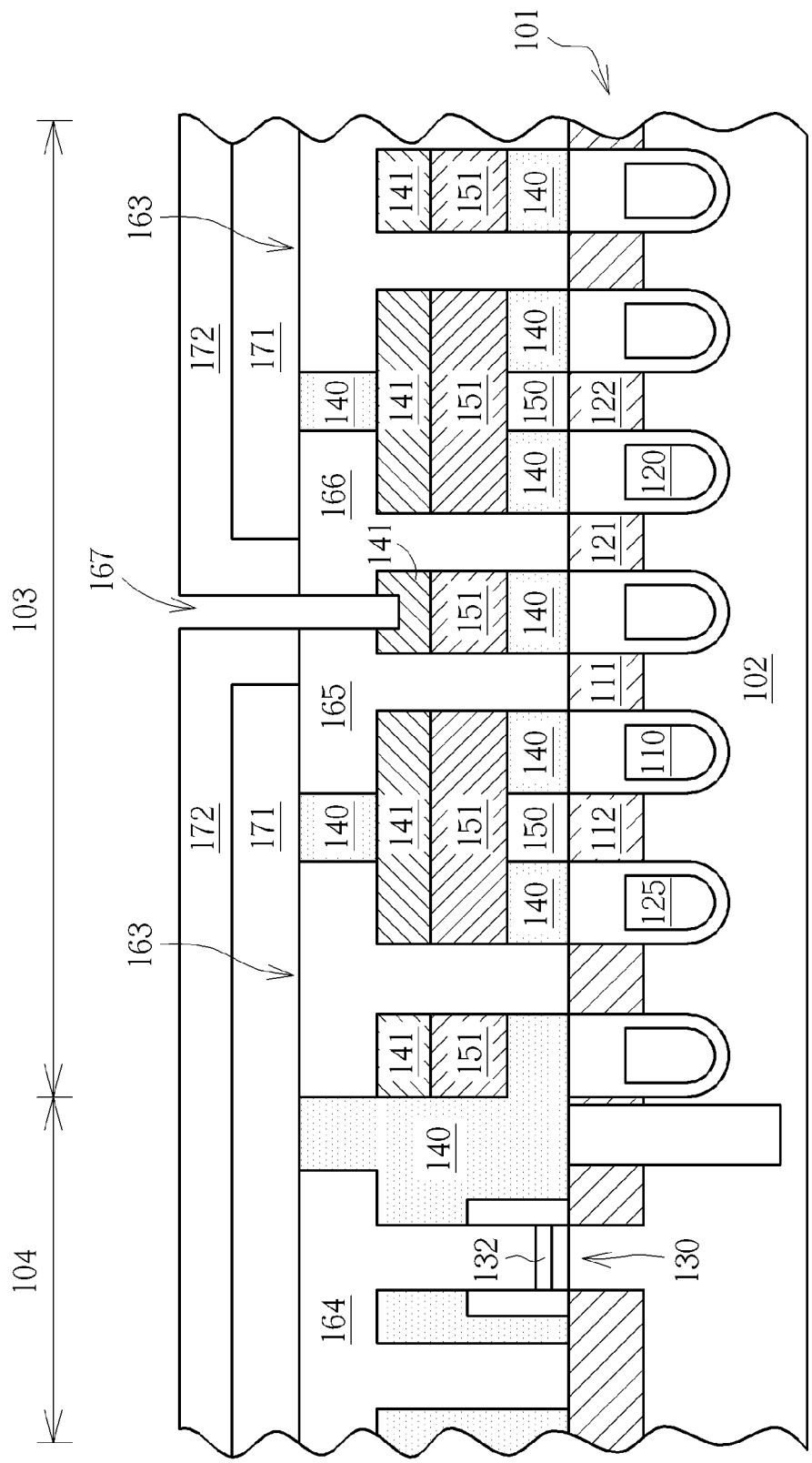
Figure 9:
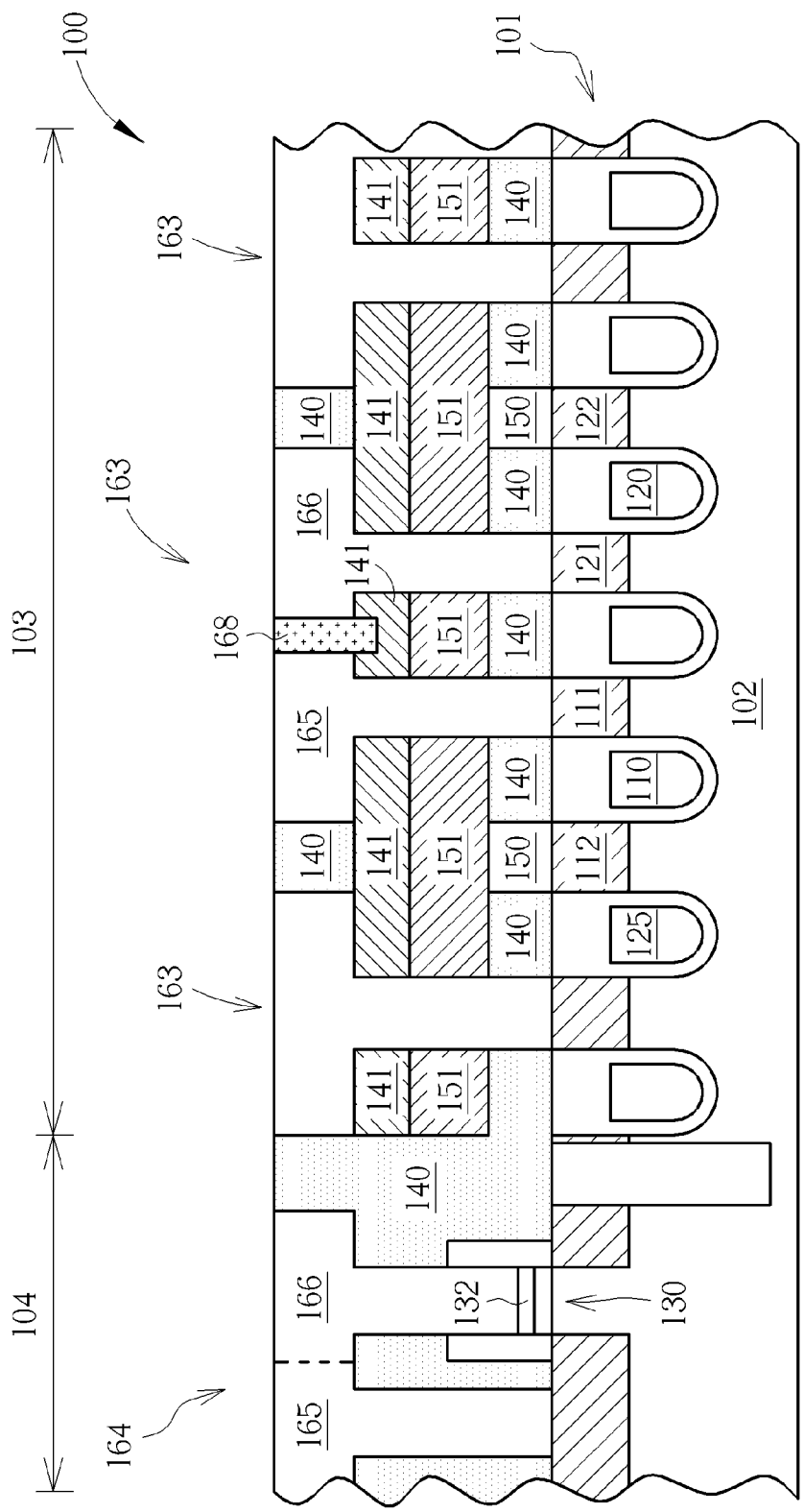
FIG. 9 illustrates the semiconductor structure with a landing pad of maximized area of the present invention.

Further, as shown in FIG. 7, the opening 171 with the inner spacer 172 vertically remaining inside the opening 171 is used to etch the conductive material of the core dual damascene plug 163 as well as some insulating layer 141 to obtain the slot 167. FIG. 8 illustrates the result after the photoresist 170 and the inner spacer 172 are removed. Then, as shown in FIG. 9, the slot 167 is filled up with a suitable insulating material to obtain an insulating slot 168 which is indirect contact with the insulating layer 141. In such a way, the insulating slot 168 is disposed right above and between the first source 111 and the second source 121. In one embodiment of the present invention, the width of the insulating slot 168, just like the width of the slot 167, not only smaller than the width of the opening 171 in FIG. 5, but also smaller than that of the first buried gate 110 as well as smaller than that of the first plug 165 and of the second plug 166.

After the above steps, the method of the present invention may obtain a semiconductor structure with a landing pad of a maximized area. FIG. 9 illustrates the semiconductor structure with a landing pad of a maximized area of the present invention. The semiconductor structure 100 of the present invention includes a substrate 102, a first buried gate 110, a second buried gate 120, a first source 111, a second source 121, a first drain 112, a second drain 122, a peripheral gate 130, an interlayer dielectric layer 140, an insulating layer 141, a bit line contact 150, a bit line 151, a core dual damascene plug and a peripheral dual damascene plug 164. In particular, the 'composite' core dual damascene plug of the semiconductor structure 100 of the present invention includes an insulating slot 168 to make the first plug 165 and the second plug 166 mutually electrically insulated.

The semiconductor structure 100 of the present invention has various advantageous features. For example, the core dual damascene plug of the semiconductor structure 100 of the present invention has the insulating slot 168 to cut off the first plug 165 and the second plug 166 and to make the first plug 165 and the second plug 166 mutually electrically insulated. At the same time, the peripheral dual damascene plug 164 is free of such insulating slot 168, so the peripheral dual damascene plug 164 may be regarded as a simple dual damascene plug which consists of and is an integration of the first plug 165 and second plug 166.

Secondly, the size of the insulating slot 168 itself is too small to be formed by a simple combination of conventional lithographic and etching methods, namely beyond the current lithographic capability. Also, due to the extremely small size of the insulating slot 168 itself, it is able to maximize the area of the core dual damascene trench type plug for use as a landing pad, in other words, to maximize the area of the first plug 165 and of the second plug 166. The possible sizes which are capable of being constructed by conventional lithographic and etching methods, namely the lithographic capability, differ as the technology generations advance, and are well understood by persons in this field so the details of the possible sizes are not described here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate;
    a first buried gate disposed in said substrate;
    a second buried gate disposed in said substrate and adjacent to said first buried gate;
    a first source disposed between said first buried gate and said second buried gate;
    a first drain disposed at one side of said first buried gate;
    a second source disposed at one side of said second buried gate;
    an interlayer dielectric layer covering said first buried gate, said second buried gate and said substrate; and
    a core dual damascene plug comprising a first plug, a second plug and an insulating slot, wherein said insulating slot is disposed between said first plug and said second plug and is recessed into a top surface of said interlayer dielectric layer so that said first plug and said second plug are mutually electrically insulated, and said first plug and said second plug respectively penetrate said interlayer dielectric layer to be respectively electrically connected to said first source and to said second source.

2. The semiconductor structure of claim 1, wherein said core dual damascene plug is disposed right above said first source.

3. The semiconductor structure of claim 1, wherein said core dual damascene plug is Π-shaped.

4. The semiconductor structure of claim 1, wherein said insulating slot is disposed right above and between said first source and said second source.

5. The semiconductor structure of claim 1, wherein the width of said insulating slot is smaller than that of said first buried gate.

6. The semiconductor structure of claim 1, wherein the width of said insulating slot is smaller than that of said first plug and of said second plug.

7. The semiconductor structure of claim 1, wherein said first plug and said second plug are respectively T-shaped to gain a maximized landing pad area.

8. The semiconductor structure of claim 1, further comprising:
    a bit line contact disposed in said interlayer dielectric layer and electrically connected to said first drain;
    a bit line disposed in said interlayer dielectric layer, above said bit line contact and electrically connected to said bit line contact, wherein said bit line and said core dual damascene plug are mutually electrically insulated from each other; and
    an insulating layer covering said bit line and directly contacting said insulating slot, wherein said first plug and said second plug respectively penetrate said insulating layer.

9. The semiconductor structure of claim 1, further comprising:
    a peripheral gate, disposed on said substrate and in said interlayer dielectric layer; and
    a peripheral dual damascene plug integrally formed by said first plug and said second plug, wherein said peripheral dual damascene plug penetrate said interlayer dielectric layer to be electrically connected to said substrate as well as said peripheral gate, wherein said peripheral dual damascene plug is Π-shaped.

10. The semiconductor structure of claim 9, wherein said peripheral dual damascene plug stays away from said core dual damascene plug and does not directly contact said bit line and said insulating layer at the same time.

* * * * *